US012573535B2

(12) United States Patent
Wei et al.

(10) Patent No.: US 12,573,535 B2
(45) Date of Patent: Mar. 10, 2026

(54) METHOD TO FORM MULTIPLE ELECTRICAL COMPONENTS AND A SINGLE ELECTRICAL COMPONENT MADE BY THE METHOD

(71) Applicant: CYNTEC CO., LTD., Hsinchu (TW)

(72) Inventors: Chih Hung Wei, Hsinchu (TW); Min Lian Kuo, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 987 days.

(21) Appl. No.: 17/731,265

(22) Filed: Apr. 28, 2022

(65) Prior Publication Data

US 2022/0351891 A1     Nov. 3, 2022

Related U.S. Application Data

(60) Provisional application No. 63/180,659, filed on Apr. 28, 2021.

(51) Int. Cl.
| | |
|---|---|
| *H01F 27/28* | (2006.01) |
| *H01F 27/02* | (2006.01) |
| *H01F 27/245* | (2006.01) |
| *H01F 27/255* | (2006.01) |
| *H01F 27/29* | (2006.01) |
| *H01F 27/30* | (2006.01) |
| *H01F 27/32* | (2006.01) |
| *H01F 41/02* | (2006.01) |
| *H01F 41/04* | (2006.01) |

(Continued)

(52) U.S. Cl.
CPC ......... *H01F 27/255* (2013.01); *H01F 27/022* (2013.01); *H01F 27/245* (2013.01); *H01F 27/2804* (2013.01); *H01F 27/29* (2013.01); *H01F 27/306* (2013.01); *H01F 27/323* (2013.01); *H01F 41/0233* (2013.01); *H01F 41/04* (2013.01); *H01F 41/041* (2013.01); *H01F 41/122* (2013.01); *H05K 1/18* (2013.01); *H05K 3/284* (2013.01); *H01F 2027/2809* (2013.01); *H05K 2201/10037* (2013.01)

(58) Field of Classification Search
CPC .... H01F 27/255; H01F 27/022; H01F 27/245; H01F 27/2804; H01F 27/29; H01F 27/306; H01F 27/323; H01F 41/0233; H01F 41/04; H01F 41/041; H01F 41/122; H01F 2027/2809; H01F 3/08; H01F 27/263; H01F 2003/106; H01F 3/10; H01F 17/0006; H01F 17/04; H01F 27/34; H05K 1/18; H05K 3/284; H05K 2201/10037; Y02E 60/10
USPC .......................................... 336/221, 83, 232
See application file for complete search history.

(56) References Cited

U.S. PATENT DOCUMENTS

| | | | |
|---|---|---|---|
| 2014/0313002 A1* | 10/2014 | Kuo | ...................... H01F 27/385 336/178 |
| 2016/0086715 A1* | 3/2016 | Lin | ......................... H01F 27/00 336/221 |

(Continued)

*Primary Examiner* — Shawki S Ismail
*Assistant Examiner* — Kazi S Hossain
(74) *Attorney, Agent, or Firm* — CKC & Partners Co., LLC

(57) ABSTRACT

An electrical component, comprising: a magnetic body and a coil disposed in the magnetic body, wherein the magnetic body comprises a first magnetic powder and a second magnetic powder, wherein the D50 of the first magnetic powder is greater than the D50 of the second magnetic powder, wherein the D90 of the first magnetic powder is not greater than 50 um, and the D90 of the second magnetic powder is not greater than 50 um.

20 Claims, 14 Drawing Sheets

700

701

(51) Int. Cl.
    *H01F 41/12*        (2006.01)
    *H05K 1/18*        (2006.01)
    *H05K 3/28*        (2006.01)

(56)                References Cited

U.S. PATENT DOCUMENTS

2016/0141087  A1*  5/2016  Liu  ........................ H01F 27/255
                                                  336/83
2019/0221357  A1*  7/2019  Sugiyama  ............. H01F 27/292
2019/0304569  A1*  10/2019  Yeh  ........................ G16B 40/00
2020/0251277  A1*  8/2020  Lin  ........................ H01F 27/327

* cited by examiner

Sample 1

Sample 2

Sample 3

Sample 4

Sample 5

Figure 3:
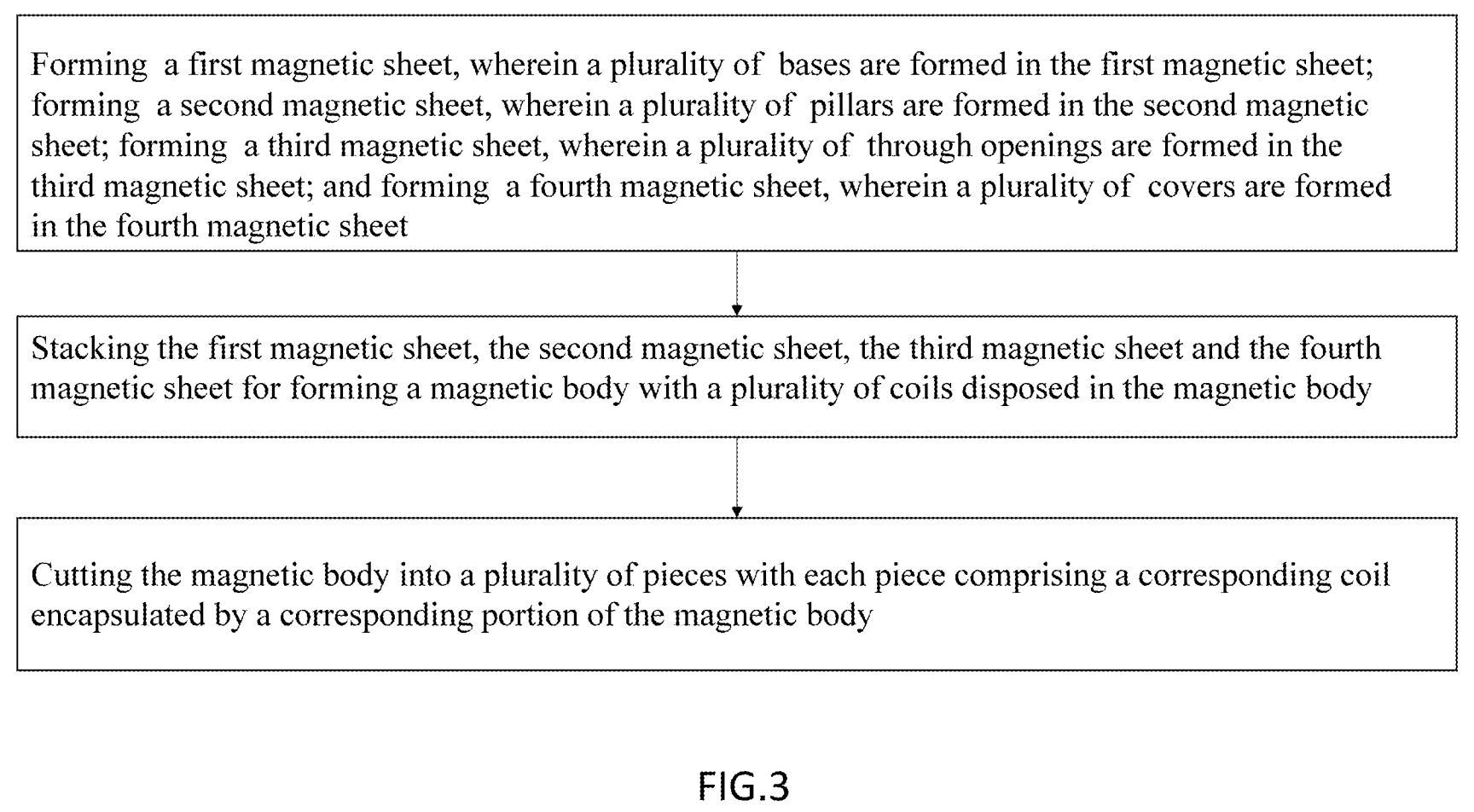

Forming a first magnetic sheet, wherein a plurality of bases are formed in the first magnetic sheet; forming a second magnetic sheet, wherein a plurality of pillars are formed in the second magnetic sheet; forming a third magnetic sheet, wherein a plurality of through openings are formed in the third magnetic sheet; and forming a fourth magnetic sheet, wherein a plurality of covers are formed in the fourth magnetic sheet Stacking the first magnetic sheet, the second magnetic sheet, the third magnetic sheet and the fourth magnetic sheet for forming a magnetic body with a plurality of coils disposed in the magnetic body Cutting the magnetic body into a plurality of pieces with each piece comprising a corresponding coil encapsulated by a corresponding portion of the magnetic body

METHOD TO FORM MULTIPLE ELECTRICAL COMPONENTS AND A SINGLE ELECTRICAL COMPONENT MADE BY THE METHOD

CROSS-REFERENCE TO RELATED APPLICATION

The present application claims the benefit of U.S. Provisional Application Ser. No. 63/180,659 filed on Apr. 28, 2021, which is hereby incorporated by reference herein and made a part of the specification.

BACKGROUND OF THE INVENTION

I. Field of the Invention

The invention relates to a method for forming an inductor, in particular for forming multiple inductors in a single process.

II. Description of the Related Art

A conventional power inductor is made by pressing filled magnetic powder with a coil wound around a bump or pillar, due to the difference of the pressure between the bump and the filled magnetic powder, the coil is easily deformed after being heated and pressed, thereby causing larger particles of the magnetic powder to penetrate the insulating layer of the coil, which can cause short circuits of the coil.

In addition, unwanted short circuits can occur when voltages are applied to the electrodes of the inductor.

Accordingly, there is a demand for a better solution to solve these problems.

SUMMARY OF THE INVENTION

One objective is to provide a method for forming multiple inductors in a single process by assembling different parts that are separately formed.

One objective is to provide an inductor for increasing the capability of preventing unwanted short circuits of the adjacent winding turns of the inductor.

One objective is to provide an inductor for increasing the capability of preventing unwanted short circuits when voltages are applied to the electrodes of the inductor.

One objective is to provide an inductor for increasing the capability of preventing erosion of the magnetic body of the inductor.

One objective is to provide an inductor that is made of multiple parts, wherein each part can be made of a corresponding material for achieving the best overall performance to meet the design requirements.

In one embodiment, an electrical component is disclosed, wherein the electrical component comprises a magnetic body and a coil comprising a plurality of winding turns disposed in the magnetic body, wherein the magnetic body comprises a first magnetic powder and a second magnetic powder mixed with the first magnetic powder, wherein the D50 of the first magnetic powder is greater than the D50 of the second magnetic powder, wherein the D90 of each of the first magnetic powder and the second magnetic powder is not greater than 50 um.

In one embodiment, an electrical component is disclosed, wherein the electrical component comprises: a magnetic body and a coil disposed in the magnetic body, wherein the magnetic body is formed by a plurality of parts, wherein the plurality of parts comprises a first part comprising a base, a second part comprising a pillar, a third part comprising a through-opening, and a fourth part comprising a cover, wherein a bottom surface of the pillar is disposed over a top surface of the base with at least one portion of the pillar being placed in a hollow space of the coil, wherein the third part is disposed over the top surface of the base with the coil and at least one portion of the pillar being placed in said through-opening of the third part, wherein the cover is disposed over the pillar and the coil with the base and the cover being located on two opposite sides of the bottom surface of the pillar, wherein the third part comprises at last one magnetic powder, wherein the D90 of each magnetic powder is not greater than 50 um.

In one embodiment, the electrical component is an inductor.

In one embodiment, the electrical component is an inductor, wherein the plurality of parts are pre-formed and made separately from each other.

In one embodiment, the third part comprises a first magnetic powder and a second magnetic powder, wherein D50 of the first magnetic powder is greater than the D50 of the second magnetic powder, wherein the D90 of each of the first magnetic powder and the second magnetic powder is not greater than 50 um.

In one embodiment, the first part comprises a third magnetic powder and a fourth magnetic powder, wherein D50 of the third magnetic powder is greater than the D50 of the fourth magnetic powder, wherein the D90 of each of the third magnetic powder and the fourth magnetic powder is not greater than 50 um.

In one embodiment, the fourth part comprises a fifth magnetic powder and a sixth magnetic powder, wherein D50 of the fifth magnetic powder is greater than the D50 of the sixth magnetic powder, wherein the D90 of each of the fifth magnetic powder and the sixth magnetic powder is not greater than 50 um.

In one embodiment, each of the first part, the second part, the third part, and the fourth part respectively comprises a first magnetic powder and a second magnetic powder, wherein D50 of the first magnetic powder is greater than the D50 of the second magnetic powder, wherein the D90 of each of the first magnetic powder and the second magnetic powder is not greater than 50 um.

In one embodiment, the magnetic body further comprises a fifth part that is disposed under the first part, wherein a first electrode and a second electrode are disposed on the first part, wherein the first electrode and the second electrode are electrically connected to the coil.

In one embodiment, the resistivity of the fifth part is greater than the resistivity of any other part of the magnetic body.

In one embodiment, the fifth part comprises an amorphous or a nanocrystalline magnetic powder.

In one embodiment, the fifth part comprises a magnetic powder, wherein the magnetic powder comprises Fe, and at least one of the following: Cr, Nb, Al, Si, and Ni.

In one embodiment, the magnetic body further comprises a sixth part that is disposed over the fourth part for increasing the capability of preventing erosion of the magnetic body.

In one embodiment, the sixth part comprises an amorphous or a nanocrystalline magnetic powder.

In one embodiment, the sixth part comprises a magnetic powder, wherein the magnetic powder comprises Fe, and at least one of the following: Cr, Nb, Al, Si, and Ni.

In one embodiment, the permeability of the second part is greater than the permeability of any other part of the said parts.

In one embodiment, the magnetic body further comprises a sixth part that is disposed over the fourth part, wherein each part is made of a corresponding magnetic material, wherein at least three different magnetic materials are used to form all of the said parts.

In one embodiment, an electrical component is disclosed, wherein the electrical component comprises: a magnetic body and a coil disposed in the magnetic body, wherein the magnetic body is formed by a plurality of parts, wherein the plurality of parts comprise a first part comprising a base, a second part comprising a pillar, a third part comprising a through-opening, and a fourth part comprising a cover, wherein a bottom surface of the pillar is disposed over a top surface of the base with at least one portion of the pillar being placed in a hollow space of the coil, wherein the third part is disposed over the top surface of the base with the coil and at least one portion of the pillar being placed in said through-opening of the third part, wherein the cover is disposed over the pillar and the coil with the base and the cover being located on two opposite sides of the bottom surface of the pillar, wherein the magnetic body further comprises a fifth part that is disposed under the first part, wherein a first electrode and a second electrode are disposed on the first part, wherein the first electrode and the second electrode are electrically connected to the coil.

In one embodiment, the first electrode comprises a metal layer that is electroplated on the bottom surface of the fifth part.

In one embodiment, the first electrode comprises a metal layer that is made of Cu.

In one embodiment, the magnetic body further comprises a sixth part that is disposed over the fourth part for increasing the capability for preventing erosion of the magnetic body.

In one embodiment, an electrical component is disclosed, wherein the electrical component comprises: a magnetic body and a coil disposed in the magnetic body, wherein the magnetic body is formed by a plurality of parts, wherein the plurality of parts comprise a first part comprising a base, a second part comprising a pillar, a third part comprising a through-opening, and a fourth part comprising a cover, wherein a bottom surface of the pillar is disposed over a top surface of the base with at least one portion of the pillar being placed in a hollow space of the coil, wherein the third part is disposed over the top surface of the base with the coil and at least one portion of the pillar being placed in said through-opening of the third part, wherein the cover is disposed over the pillar and the coil with the base and the cover being located on two opposite sides of the bottom surface of the pillar, wherein the magnetic body further comprises a fifth part disposed under the first part and a sixth part disposed over the fourth part, wherein each part is made of a corresponding magnetic material with at least three different magnetic materials being used to form all of the said parts.

In one embodiment, an electrical component is disclosed, wherein the electrical component comprises: a magnetic body and a coil disposed in the magnetic body, wherein the magnetic body comprises at last one magnetic powder, wherein the D90 of each magnetic powder is not greater than 50 um.

In one embodiment, the magnetic body comprises a first magnetic powder and a second magnetic powder, wherein D50 of the first magnetic powder is greater than the D50 of the second magnetic powder, wherein the D90 of each of the first magnetic powder and the second magnetic powder is not greater than 50 um.

In one embodiment, the magnetic body comprises a unitary body, wherein the coil is disposed inside the unitary body.

In one embodiment, a method to form an electrical component is disclosed, wherein the method comprises: forming a first magnetic sheet, wherein a plurality of bases are formed in the first magnetic sheet; forming a second magnetic sheet, wherein a plurality of pillars are formed in the second magnetic sheet; forming a third magnetic sheet, wherein a plurality of through-openings are formed in the third magnetic sheet; forming a fourth magnetic sheet, wherein a plurality of covers are formed in the fourth magnetic sheet; and forming a fifth magnetic sheet, wherein a plurality of lower bases are formed in the fifth magnetic sheet; stacking the first magnetic sheet, the second magnetic sheet, the third magnetic sheet, the fourth magnetic sheet, and the fifth magnetic sheet for forming a magnetic body with a plurality of coils disposed in the magnetic body, wherein a bottom surface of a pillar is disposed over a top surface of a corresponding base with at least one portion of the pillar being placed in a hollow space of a corresponding coil, wherein the coil and at least one portion of the pillar being placed in a corresponding through-opening that is located above the top surface of the corresponding base, and a corresponding cover is disposed over the pillar and the coil, wherein a corresponding lower base is disposed under the base; and cutting the magnetic body into a plurality of pieces with each piece comprising a corresponding coil encapsulated by a corresponding portion of the magnetic body.

In one embodiment, said forming step further comprising forming a sixth magnetic sheet, wherein a plurality of upper covers are formed in the sixth magnetic sheet; and said stacking step further comprising stacking the sixth magnetic sheet over the fourth magnetic sheet for forming the magnetic body, wherein a corresponding upper cover is disposed over the cover.

In one embodiment, an electrical component is disclosed, wherein the electrical component comprises: comprises: a magnetic body and a coil disposed in the magnetic body, wherein the magnetic body comprises a first magnetic portion and a second magnetic portion disposed under the first magnetic portion, wherein the first magnetic portion is located between a bottom surface of the coil and the second magnetic portion, wherein at least one portion of the first electrode and at least one portion of the second electrode are disposed on the bottom surface of the second magnetic portion, wherein the first electrode and the second electrode are electrically connected to the coil, wherein a resistivity of the second magnetic portion is greater than a resistivity of the first magnetic portion.

In one embodiment, the electrical component is an inductor.

BRIEF DESCRIPTION OF THE DRAWINGS

The present invention can be more fully understood by reading the subsequent description and examples with references made to the accompanying drawings, wherein:

FIG. 3 illustrates a flow chart of a method to form an electrical component according to one embodiment of the present invention;

DETAILED DESCRIPTION OF THE INVENTION

Figure 1A:
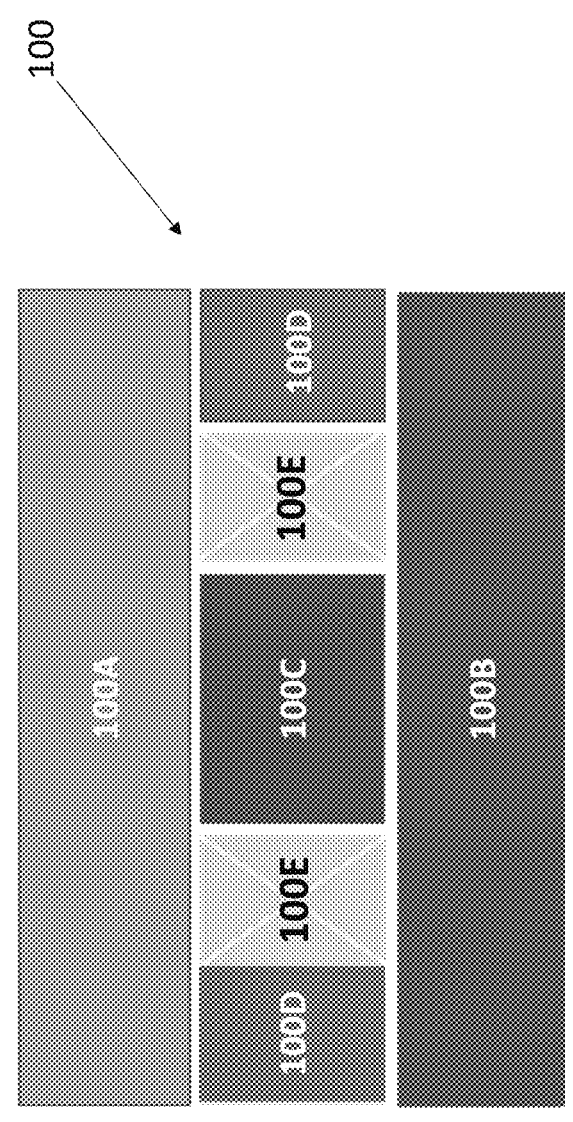
FIG. 1A illustrates a side view of an electrical component according to one embodiment of the present invention.

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. This repetition is for simplicity and clarity and does not in itself dictate a relationship between the various embodiments and/or configurations discussed.

Figure 1B:
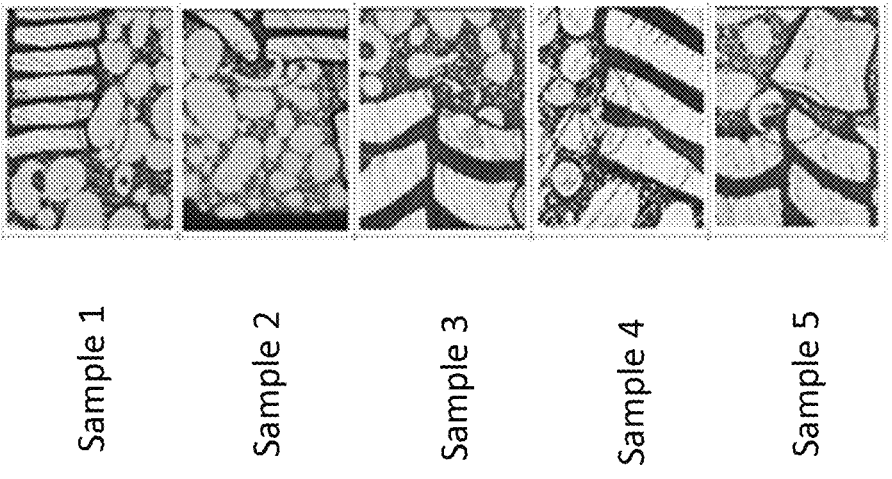
FIG. 1B illustrates different ways of adjacent winding turns of the coil that may be shorted caused by a large particle of a magnetic powder.
Figure 1C:
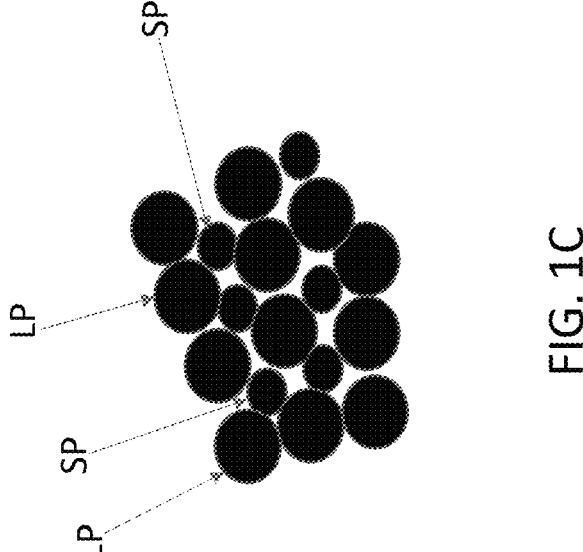
FIG. 1C illustrates a first magnetic powder and a second magnetic powder mixed with the first magnetic powder.

FIG. 1A illustrates a side view of an electrical component 100, wherein the electrical component 100 comprises: a magnetic body and a coil 100E comprising a plurality of winding turns disposed in the magnetic body, wherein the magnetic body is formed by a plurality of parts 100A, 100B, 100C, 100D, wherein the plurality of parts 100A, 100B, 100C, 100D comprises a first part 100B comprising a base, a second part 100C comprising a pillar, a third part 100D comprising a through-opening therein, and a fourth part 100A comprising a cover, wherein a bottom surface of the pillar of the second part 100C is disposed over a top surface of the base of the first part 100B with at least one portion of the pillar of the second part 100C being placed in a hollow space of the coil 100E, wherein the third part 100D is disposed over the top surface of the base of the first part 100B with the pillar of the second part 100C and the coil 100E being placed in said through-opening of the third part 100D, wherein the cover of the fourth part 100A is disposed over the pillar of the second part 100C and the coil 100E with the base of the first part 100B and the cover of the fourth part 100A being located on two opposite sides of said bottom surface of the pillar of the second part 100C, the third part 100D comprises a first magnetic powder LP and a second magnetic powder SP, wherein the D50 of the first magnetic powder LP is greater than the D50 of the second magnetic powder SP, wherein the D90 of each of the first magnetic powder LP and the second magnetic powder SP is not greater than 50 um, as shown in FIG. 1C, thereby increasing the capability of preventing unwanted short circuits of the coil caused by the larger particles of the magnetic powders, as shown in FIG. 1B, which will be described hereafter. By controlling the size of the large particles, the unwanted short circuits between winding turns of the coil can be significantly reduced.

In one embodiment, the coil is formed by a conductive wire comprising a metal wire and an insulating layer encapsulating the metal wire.

In one embodiment, the coil is formed by a conductive wire comprising a metal wire and a first insulating layer encapsulating the metal wire and a self-adhesive layer encapsulating the first insulating layer.

In one embodiment, the conductive wire is an enameled wire.

In one embodiment, the first magnetic powder comprises Fe.

In one embodiment, the second magnetic powder comprises Fe.

In one embodiment, the second part comprises a nanocrystalline magnetic powder.

In one embodiment, the third part comprises a nanocrystalline magnetic powder.

In one embodiment, the first part 100B comprises a third magnetic powder and a fourth magnetic powder, wherein D50 of the third magnetic powder is greater than the D50 of the fourth magnetic powder, wherein the D90 of each of the third magnetic powder and the fourth magnetic powder is not greater than 50 um.

In one embodiment, the fourth part 100A comprises a fifth magnetic powder and a sixth magnetic powder, wherein D50 of the fifth magnetic powder is greater than the D50 of the sixth magnetic powder, wherein the D90 of each of the fifth magnetic powder and the sixth magnetic powder is not greater than 50 um.

In one embodiment, each of the first part 100B, the third part 100D, and the fourth part 100A respectively comprises a first magnetic powder and a second magnetic powder, wherein D50 of the first magnetic powder is greater than the D50 of the second magnetic powder, wherein the D90 of the first magnetic powder is not greater than 50 um and the D90 of the second magnetic powder is not greater than 50 um.

In one embodiment, each of the first part 100B, the second part 100C, the third part 100D, and the fourth part 100A respectively comprises a first magnetic powder and a second magnetic powder, wherein the D50 of the first magnetic powder is greater than the D50 of the second magnetic powder, wherein the D90 of the first magnetic powder is not greater than 50 um and the D90 of the second magnetic powder is not greater than 50 um.

In one embodiment, each of the first part 100B, the second part 100C, the third part 100D, and the fourth part 100A respectively comprises a first magnetic powder and a second magnetic powder, wherein D50 of the first magnetic powder is greater than the D50 of the second magnetic powder, wherein the D90 of the first magnetic powder is not greater than 50 um and the D90 of the second magnetic powder is not greater than 50 um.

In one embodiment, the electrical component is an inductor, wherein the plurality of parts are pre-formed and made separately from each other.

FIG. 1B illustrates adjacent winding turns of the coil that can be shorted caused by a large particle of a magnetic powder with the D90 of the magnetic powder being greater than 50 um. For example, each of sample 1 and sample 4 shows two adjacent winding turns that are placed along a horizontal direction and can be shorted caused by a large particle of a magnetic powder; each of sample 2, sample 3, and sample 5 shows two adjacent winding turns that are placed along a vertical direction and can be shorted caused by a large particle of a magnetic powder. Please note that in some applications, adjacent winding turns are only present in a vertical direction or along the axial direction of the coil. That is, large particles near adjacent portions of the coil may cause unwanted short circuits, and therefore, the size of such particles needs to be controlled.

Figures 2A, 2B, 2C, 2D, 2E:
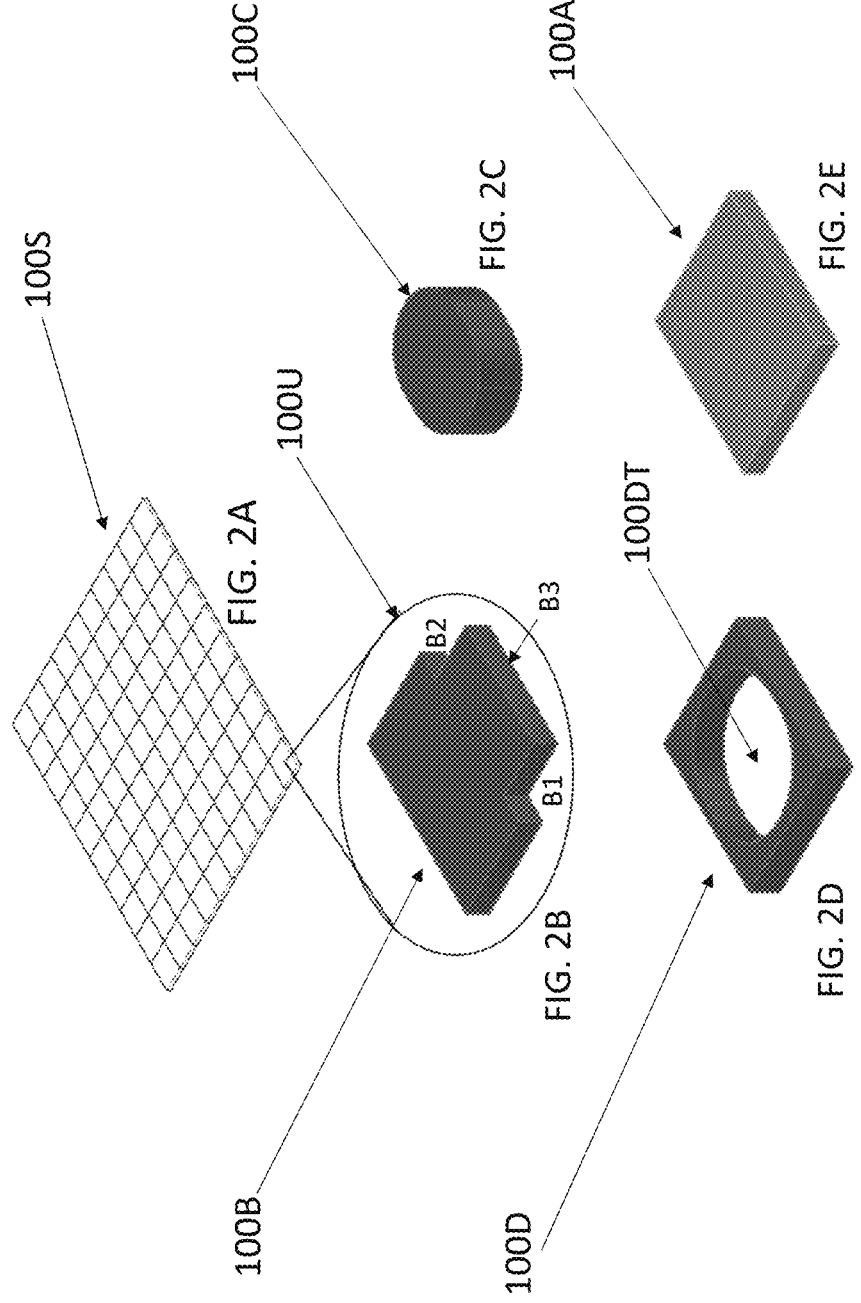
FIG. 2A shows a magnetic sheet that can be used to form a particular part for forming a magnetic body of the electrical component according to an embodiment of the invention.
FIG. 2B shows the magnetic sheet can be used to form base parts in quantities according to an embodiment of the invention.
FIG. 2C shows the magnetic sheet can be used to form pillar parts in quantities according to an embodiment of the invention.
FIG. 2D shows the magnetic sheet can be used to form hollow parts with through-openings therein in quantities according to an embodiment of the invention.
FIG. 2E shows the magnetic sheet can be used to form cover parts in quantities according to an embodiment of the invention.

FIG. 2A shows a magnetic sheet 100S that can be used to form a particular part for forming a magnetic body of the electrical component according to an embodiment of the invention.

For example, the magnetic sheet 100S can be used to form the first part 100B in quantities, wherein in each unit 100U of the magnetic sheet 100S has the first part 100B comprising a base, as shown in FIG. 2B.

For example, another magnetic sheet 100S can be used to form the second part 100C in quantities as shown in FIG. 2C, wherein in each unit 100U of the magnetic sheet 100S has the second part 100C comprising a pillar.

For example, another magnetic sheet 100S can be used to form the third part 100D in quantities, wherein in each unit 100U of the magnetic sheet 100S has the third part 100D comprising a through-opening 100DT therein, as shown in FIG. 2D.

For example, another magnetic sheet 100S can be used to form the fourth part 100A in quantities as shown in FIG. 2E, wherein in each unit 100U of the magnetic sheet 100S has the fourth part 100D comprising a cover.

Please note that the material of the magnetic sheet 100S can be different for forming different parts of the magnetic body.

In one embodiment, the electrical component 100 is an inductor, such as a choke or a power inductor.

In one embodiment, the first part 100B comprising the base is made of a first magnetic material and the second part 100C comprising the pillar is made of a second magnetic material, wherein the first magnetic material and the second magnetic material are different magnetic materials.

In one embodiment, the third part 100D comprising the through-opening is made of a third magnetic material, wherein the first magnetic material, the second magnetic material, and the third magnetic material are different from each other.

In one embodiment, the fourth part 100A comprising the cover is made of a fourth magnetic material, wherein the first magnetic material, the second magnetic material, the third magnetic material, and the fourth magnetic material are different from each other.

In one embodiment, the first part 100B comprising the base is made of a first magnetic material, and each of the second part 100C, the third part 100D, and the fourth part 100A is made of a second magnetic material, wherein the first magnetic material and the second magnetic material are different magnetic materials.

In one embodiment, as shown in FIG. 2B, the base of the first part 100B has a protrusion B3 extended from a side surface of the base to form a first opening B1 and a second opening B2 at two corners of the base.

In one embodiment, the cover of the fourth part 100A has an I shape.

In one embodiment, the coil 100E is a pre-wound coil, wherein the pre-wound coil is disposed on the base of the first part 100B and surrounding the pillar of the second part 100C.

In one embodiment, the terminal part T1, T2, of the conductive wire forming the coil 100E can be exposed from the bottom surface of the magnetic body for forming an electrode of the electrical component.

In one embodiment, the terminal part T1, T2, of the conductive wire forming the coil 100E can be exposed from a lateral surface of the magnetic body for forming an electrode of the electrical component.

FIG. 3 illustrates a flow chart of a method to form an electrical component according to one embodiment of present invention, wherein the method comprises: step S101: forming a first magnetic sheet, wherein a plurality of bases are formed in the first magnetic sheet; forming a second magnetic sheet, wherein a plurality of pillars are formed in the second magnetic sheet; forming a third magnetic sheet, wherein a plurality of through-openings are formed in the third magnetic sheet; and forming a fourth magnetic sheet, wherein a plurality of covers are formed in the fourth magnetic sheet; step S102: stacking the first magnetic sheet, the second magnetic sheet, the third magnetic sheet and the fourth magnetic sheet for forming a magnetic body with a plurality of coils disposed in the magnetic body, wherein a bottom surface of each pillar is disposed over a top surface of a corresponding base with at least one portion of the pillar being placed in a hollow space of a corresponding coil; the third part is disposed over the top surface of said base with said pillar and said coil being placed in a corresponding through-openings; and a corresponding cover is disposed over said pillar and said coil; step S103: cutting the magnetic body into a plurality of pieces with each piece comprising a corresponding coil encapsulated by a corresponding portion of the magnetic body.

In one embodiment, the electrical component 100 is an inductor.

In one embodiment, the first part 100B comprising the base is made of a first magnetic material and the second part 100C comprising the pillar is made of a second magnetic material, wherein the first magnetic material and the second magnetic material are different magnetic materials.

In one embodiment, the third part 100D comprising the through-openings is made of a third magnetic material, wherein the first magnetic material, the second magnetic material, and the third magnetic material are different from each other.

In one embodiment, the coil 100E is a pre-wound coil, wherein the pre-wound coil is disposed on the base of the first part 100B and surrounding the pillar of the second part 100C.

There are many ways to make the electrical component 100, such as, but not limited to, the first embodiment and the second embodiment described below.

First Embodiment

Figures 4A, 4B:
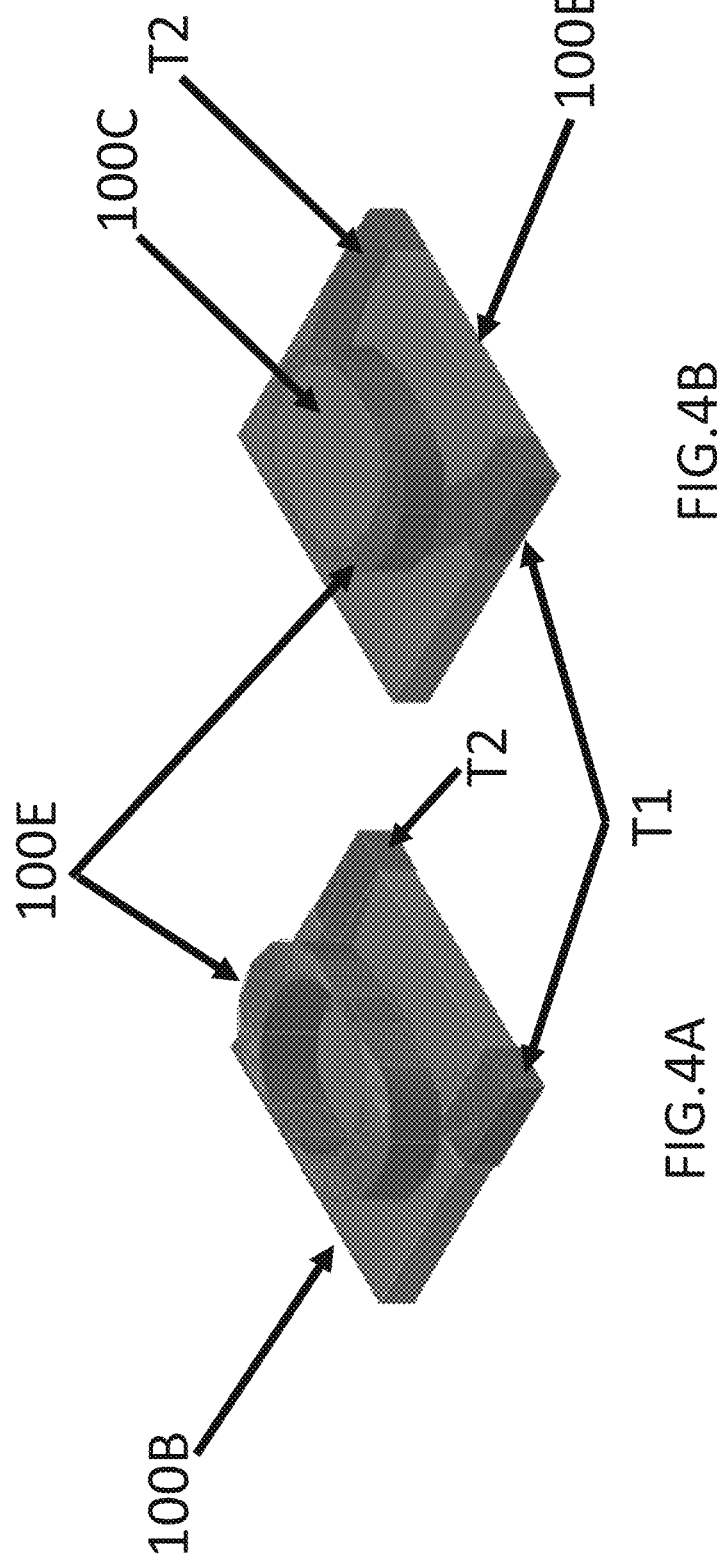
FIG. 4A-4E shows a process for forming the magnetic body of the inductor according to one embodiment of the invention.
Figures 4C, 4D:
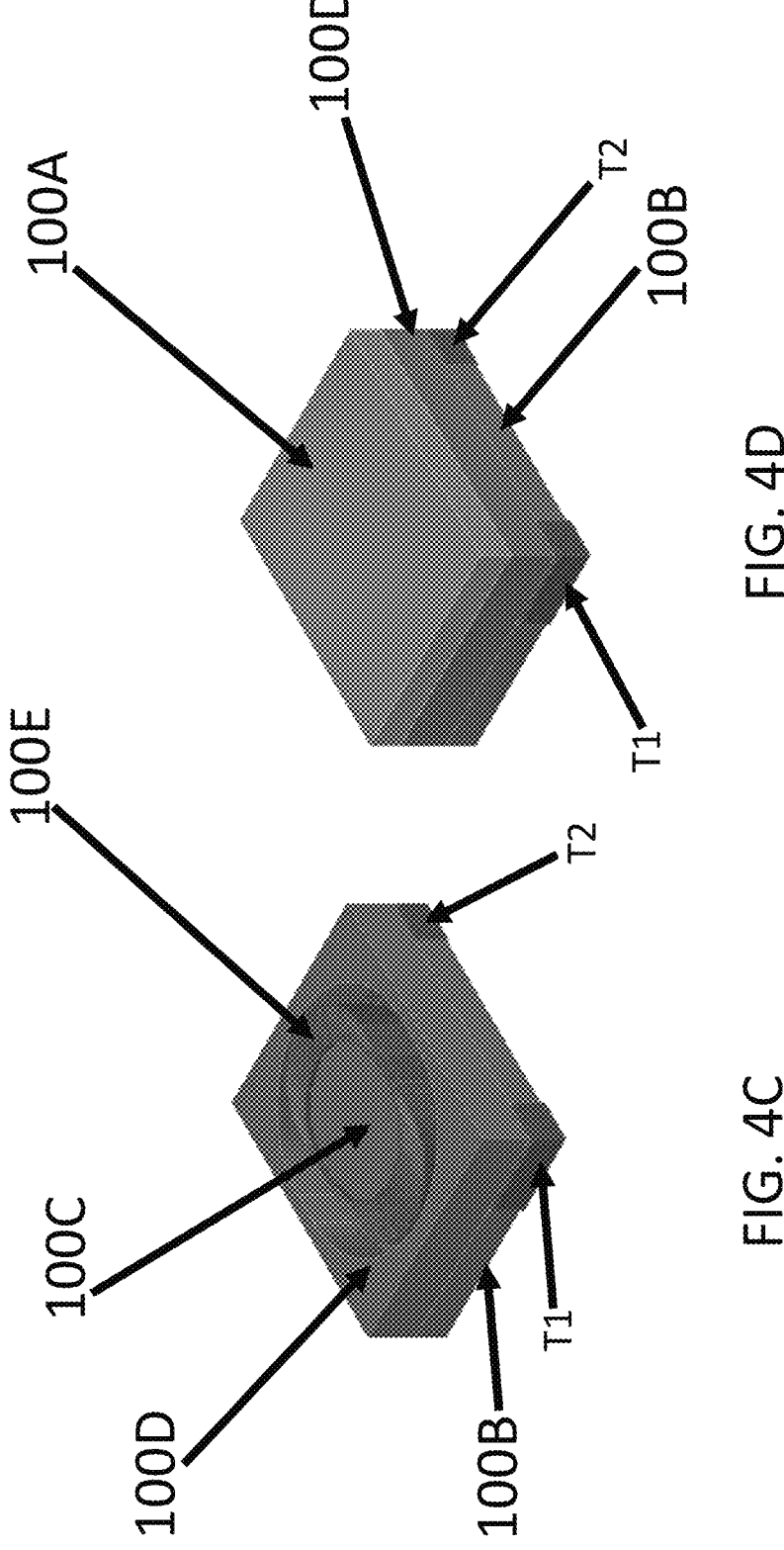
Figure 4E:
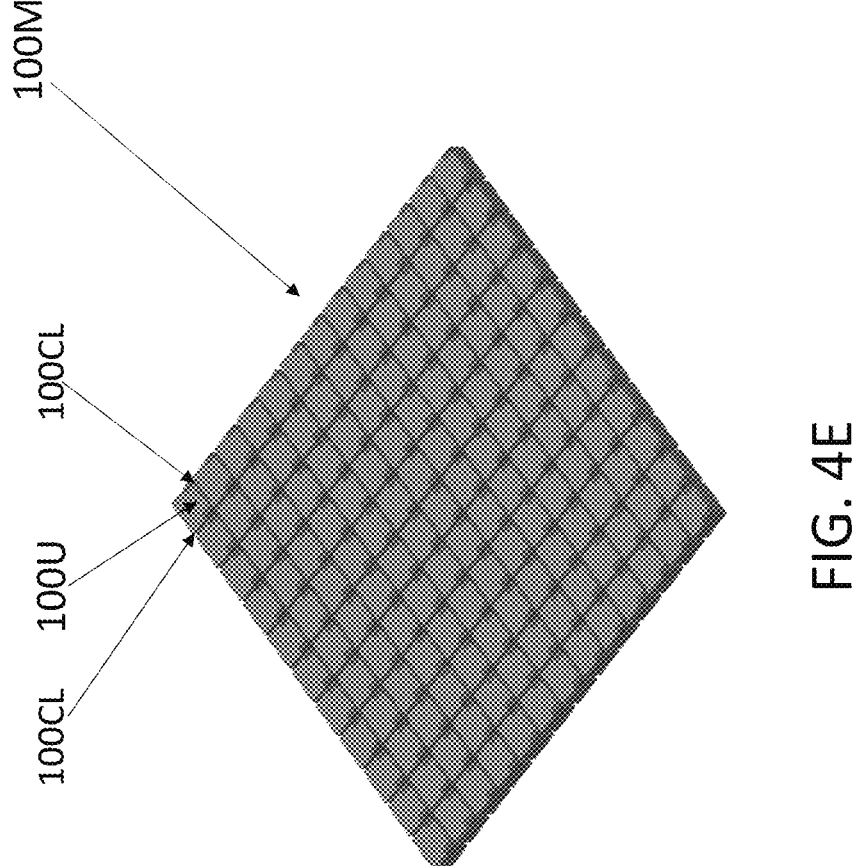
Figure 4F:
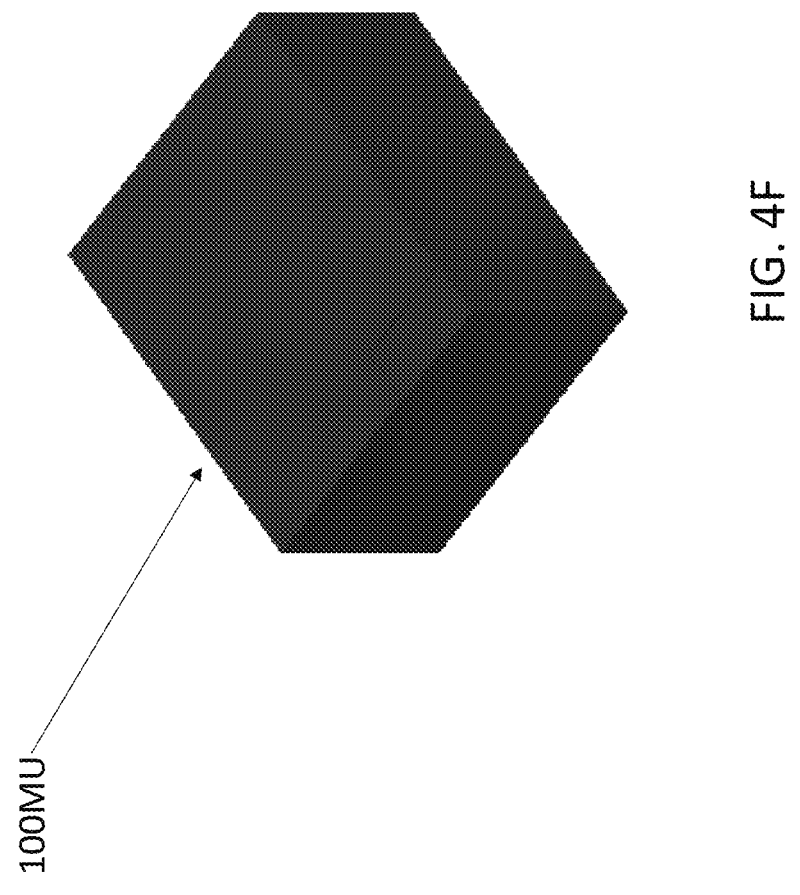
FIG. 4F shows a single piece of an inductor according to an embodiment of the invention.

Please refer to FIG. 4A-4F, disposing a plurality of coils on the first magnetic sheet, wherein in each unit of the magnetic sheet, a corresponding coil 100E is disposed on a corresponding base 100B of the first magnetic sheet, as shown in FIG. 4A; then, stacking the second magnetic sheet over the first magnetic sheet, wherein each pillar 100C of the second magnetic sheet is placed in a hollow space of said coil 100E, as shown in FIG. 4B, wherein said coil 100E is formed by a corresponding conductive wire as shown in FIG. 4B, wherein each terminal part T1, T2 of the conductive wire is respectively disposed in a corresponding through-opening of the base 100B, as shown in FIG. 4B; then, stacking the third magnetic sheet over the first magnetic sheet, wherein the coil 100E is disposed in a corresponding through-openings of the hollow part 100D as shown in FIG. 4C; then, stacking the fourth magnetic sheet over the second magnetic sheet and the third magnetic sheet, wherein the fourth magnetic sheet having the cover 100A is placed over the coil 100E and the pillar 100C, as shown in FIG. 4D to form a magnetic body; then, the magnetic body 100M can be cut into a plurality of pieces along a plurality of cutting line 100CL, as shown in FIG. 4E, wherein each piece 100U comprises a corresponding coil encapsulated by a corresponding portion of the magnetic body 100MU, as shown in FIG. 4F.

In one embodiment, wherein a plurality of winding turns of the coil is formed by the conductive wire, wherein the conductive wire comprises a metal wire and at least one insulating layer encapsulating the metal wire.

In one embodiment, the conductive wire is an enameled wire.

In one embodiment, the conductive wire forming is a flat wire.

In one embodiment, the conductive wire forming is a round wire.

Second Embodiment

Figures 5A, 5B:
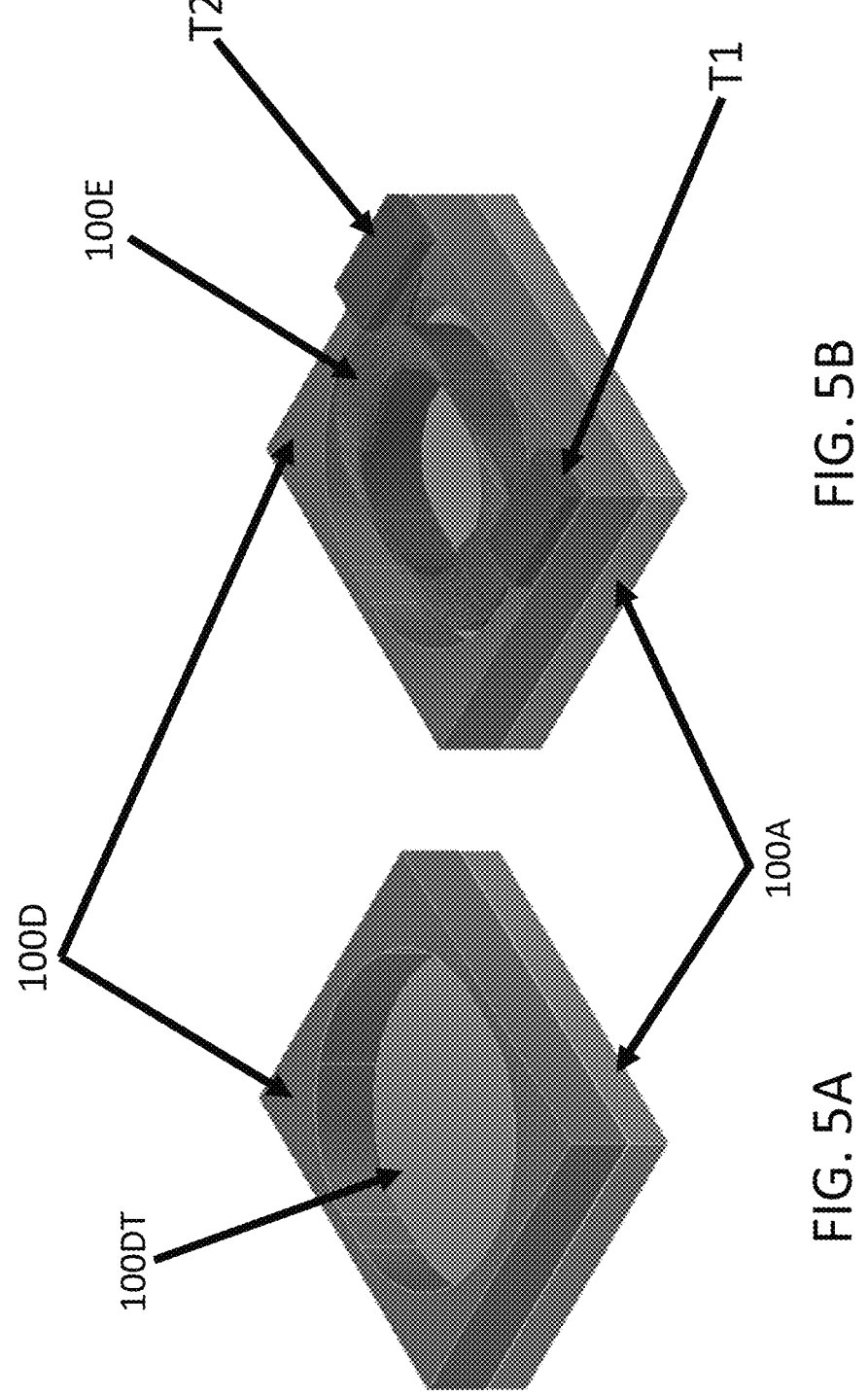
FIG. 5A-5D shows another process for assembling the parts to form the magnetic body of the inductor according to one embodiment of the invention.
Figures 5C, 5D:
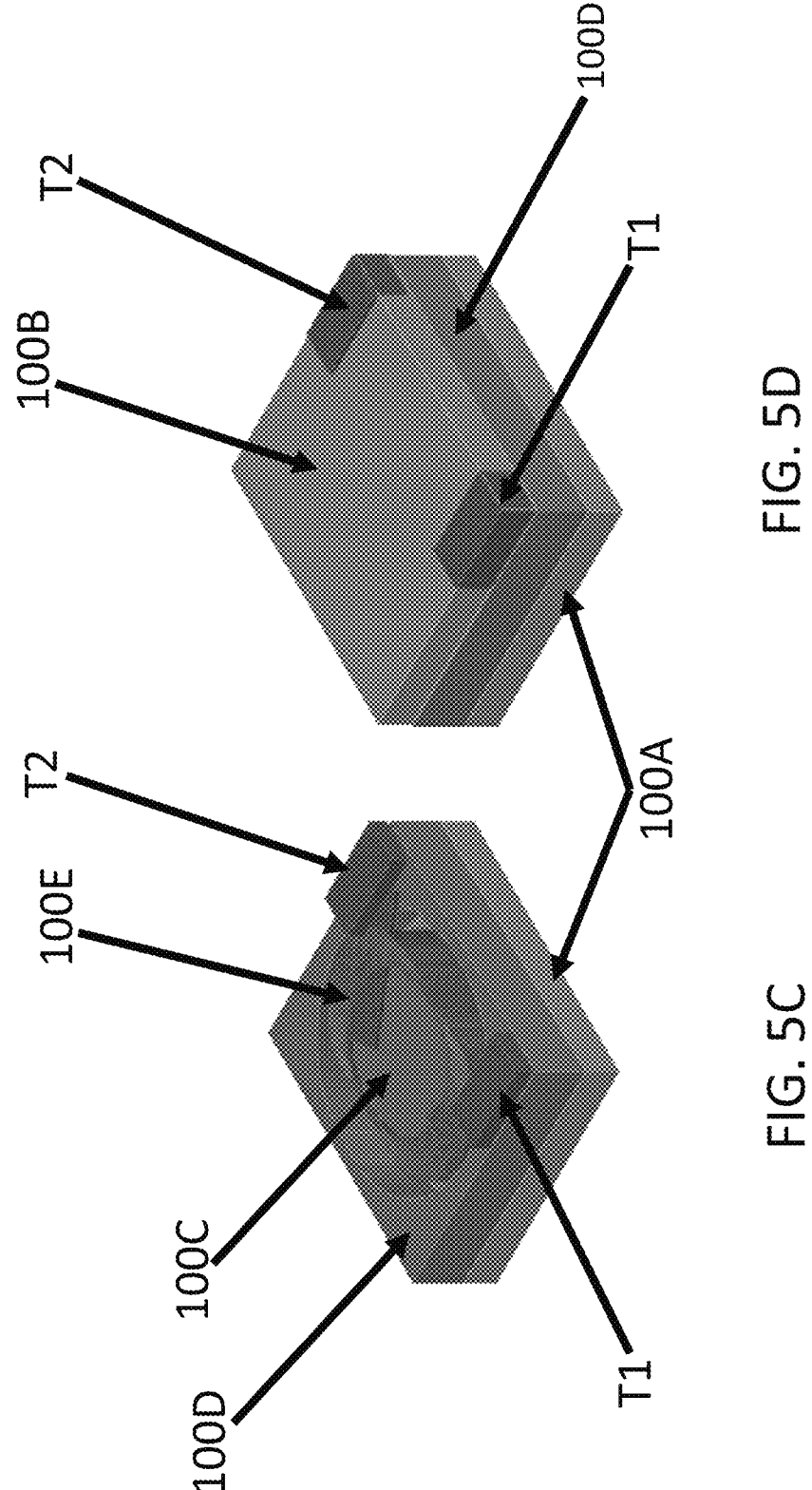

Please refer to FIG. 5A-5D, stacking the third magnetic sheet comprising through-openings over the fourth magnetic sheet comprising covers, wherein in each unit, the third part 100D having a through-opening 100DT is disposed over the cover 100A, as shown in FIG. 5A; then, disposing a plurality of coils on the fourth magnetic sheet, wherein in each unit, a coil 100E is placed in the through-opening 100DT, as shown in FIG. 5B; then, stacking the second magnetic sheet over the fourth magnetic sheet, wherein in each unit, a pillar 100C is placed in a hollow space of the coil 100E as shown in FIG. 5C; then, stacking the first magnetic sheet over the second magnetic sheet and the third magnetic sheet to form a magnetic body, wherein in each unit, a base of the first part 100B is placed over the pillar 100C and the coil 100E as shown in FIG. 5D; then the magnetic body 100M can be cut into a plurality of pieces along a plurality of cutting line 100CL, as shown in FIG. 4E, wherein each piece 100U comprises a corresponding coil 100E encapsulated by a corresponding portion of the magnetic body 100M.

In one embodiment of the present invention, said magnetic sheets or magnetic layers can be in a semi-cured state before pressing and/or heating said magnetic sheets; and then semi-cured magnetic sheets can be pressed and/or heated to form a solid magnetic body for subsequent cutting step.

In one embodiment, wherein a plurality of winding turns of the coil is formed by the conductive wire, wherein the conductive wire comprises a metal wire and at least one insulating layer encapsulating the metal wire.

In one embodiment, the conductive wire is an enameled wire.

In one embodiment, the conductive wire forming is a flat wire.

In one embodiment, the conductive wire forming is a round wire.

Figure 6:
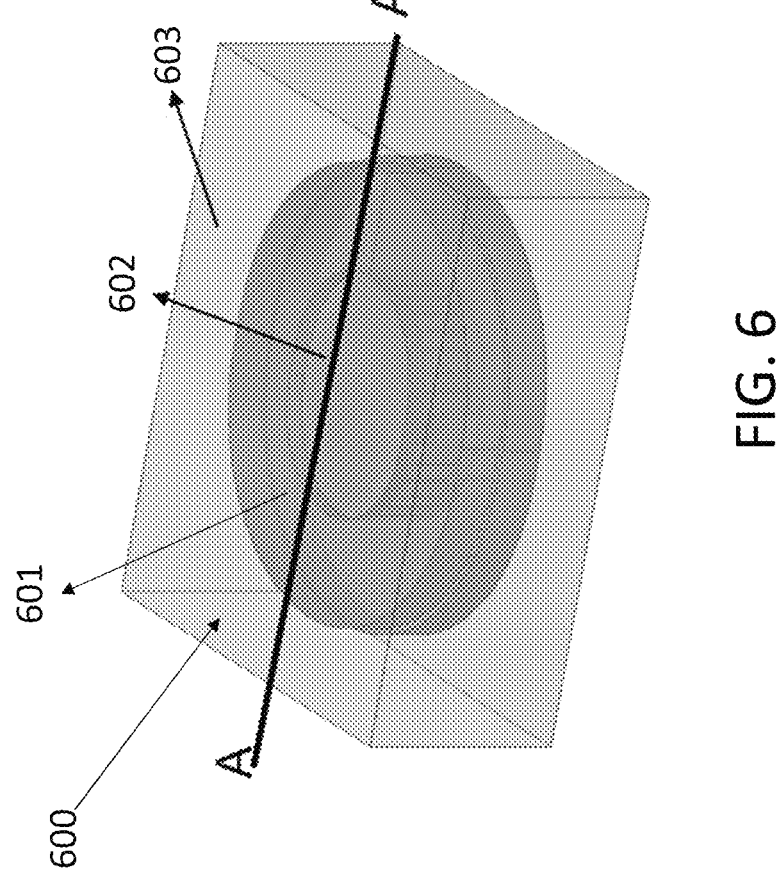
FIG. 6 illustrates a top view of an electrical component according to another embodiment of the present invention.

FIG. 6 illustrates a top view of an electrical component according to another embodiment of the present invention, wherein line AA' is a horizontal line passing the magnetic body 600.

In one embodiment, as shown in FIG. 6, an electrical component is disclosed, wherein the electrical component comprises a magnetic body 600 and a coil 601 disposed in the magnetic body 600, wherein the magnetic body 600 comprises a first magnetic powder and a second magnetic powder mixed with the magnetic powder, as shown in FIG. 1C, wherein the D50 of the first magnetic powder is greater than the D50 of the second magnetic powder, wherein the D90 of the first magnetic powder is not greater than 50 um, and the D90 of the second magnetic powder is not greater than 50 um.

In one embodiment, the coil is formed by a conductive wire comprising a metal wire and at least one insulating layer encapsulating the metal wire.

In one embodiment, the coil is formed by a conductive wire comprising a metal wire and a first insulating layer encapsulating the metal wire and a self-adhesive layer encapsulating the first insulating layer.

In one embodiment, the conductive wire is an enameled wire.

In one embodiment, the magnetic body 600 comprises a unitary body, wherein the coil is disposed inside the unitary body.

In one embodiment, the magnetic body 600 comprises a unitary body, wherein the unitary body encapsulates the top surface of the coil and extends into the hollow space of the coil.

In one embodiment, the coil 601 is wound around a pillar 602, wherein the permeability of the pillar 602 is greater than the permeability of the portion 603 of the magnetic body 600.

In one embodiment, the entire magnetic body 600 is unitary, wherein the coil is disposed inside the unitary magnetic body 600.

Figure 7A:
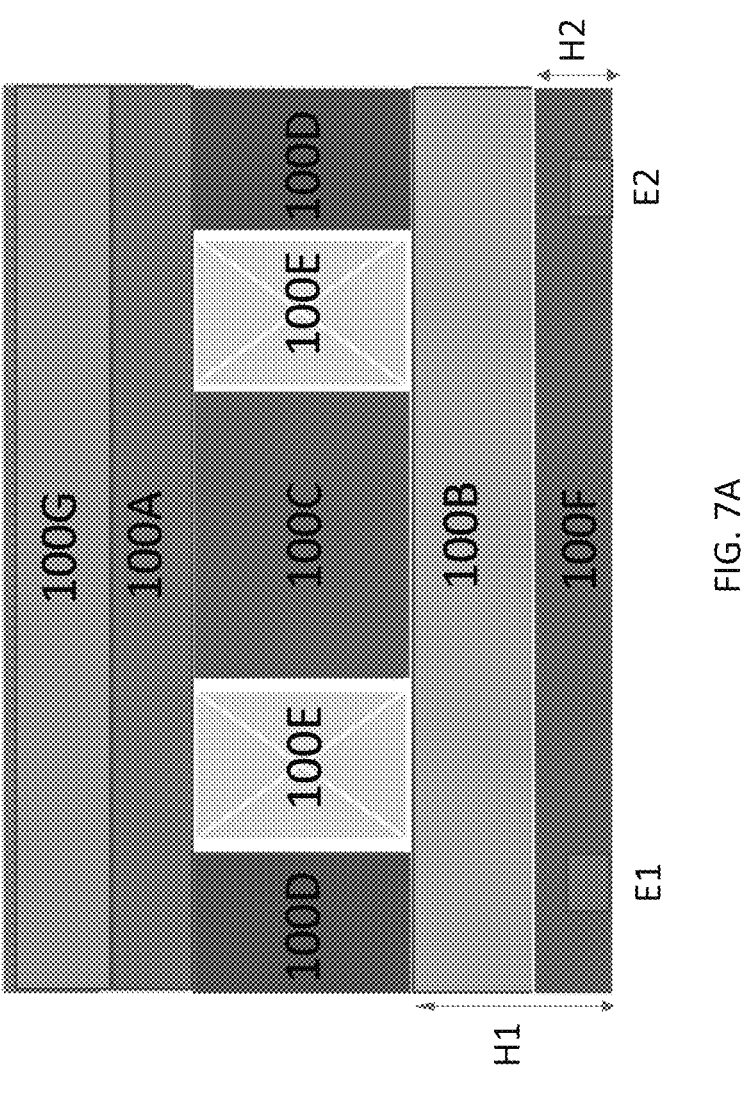
FIG. 7A illustrates a side view of an electrical component according to one embodiment of the present invention.

FIG. 7A illustrates a side view of an electrical component 700, wherein the electrical component 700 comprises: a magnetic body and a coil 100E disposed in the magnetic body, wherein the magnetic body is formed by a plurality of parts 100A, 100B, 100C, 100D, wherein the plurality of parts 100A, 100B, 100C, 100D comprises a first part 100B comprising a base, a second part 100C comprising a pillar, a third part 100D comprising a through-opening therein, and a fourth part 100A comprising a cover, wherein a bottom surface of the pillar of the second part 100C is disposed over a top surface of the base of the first part 100B with at least one portion of the pillar of the second part 100C being placed in a hollow space of the coil 100E, wherein the third part 100D is disposed over the top surface the base of the first part 100B with the pillar of the second part 100C and the coil 100E being placed in said through-opening of the third part 100D, wherein the cover of the fourth part 100A is disposed over the pillar of the second part 100C and the coil 100E with the base of the first part 100B and the cover of the fourth part 100A being located on two opposite sides of said bottom surface of the pillar of the second part 100C, wherein the magnetic body further comprises a fifth part 100F that is disposed under the first part 100B, wherein at least one portion of the first electrode E1 and at least one portion of the second electrode E2 are disposed on the bottom surface of the fifth part 100F, wherein the first electrode E1 and the second electrode E2 are electrically connected to the coil 100E, thereby increasing the capability of withstand voltages applied to the electrodes so as to avoid short circuits between the electrodes, or between an electrode to the coil.

Please note that the magnetic sheet 100S of FIG. 2A can be used for forming a corresponding part of the magnetic body of the electrical component 700, wherein the magnetic sheet 100S can be made a suitable material for forming each part of the magnetic body of the electrical component 700, respectively.

In one embodiment, the first part and the fifth part are made of different materials, and the resistivity of the fifth part is greater than the resistivity of the first part.

In one embodiment, the fifth part 100F has an I shape.

In one embodiment, the resistivity of the fifth part is greater than the resistivity of any other part of the magnetic body.

In one embodiment, as shown in FIG. 7A, the thickness H2 of the fifth part 100F is in a range of 30 um to 60 um; and the total thickness H1 of the first part 100B and the fifth part 100F is in a range of 130 um to 160 um.

In one embodiment, the thickness H2 of the fifth part 100F is in a range of 30 um to 50 um; and the total thickness H1 of the first part 100B and the fifth part 100F is in a range of 140 um to 150 um.

In one embodiment, the coil is formed by a conductive wire comprising a metal wire and at least one insulating layer encapsulating the metal wire.

In one embodiment, the coil is formed by a conductive wire comprising a metal wire and a first insulating layer encapsulating the metal wire and a self-adhesive layer encapsulating the first insulating layer.

In one embodiment, the conductive wire is an enameled wire.

In one embodiment, the fifth part 100F comprises an amorphous or a nanocrystalline magnetic powder.

In one embodiment, the fifth part 100F comprises a magnetic powder, wherein the magnetic powder comprises Fe, and at least one of the following: Cr, Nb, Al, Si, and Ni.

In one embodiment, the magnetic body further comprises a sixth part 100G that is disposed over the fourth part 100A for increasing the capability of preventing erosion of the magnetic body.

In one embodiment, the sixth part 100G has an I shape.

In one embodiment, the sixth part 100G comprises an amorphous or a nanocrystalline magnetic powder.

In one embodiment, the sixth part 100G comprises a magnetic powder, wherein the magnetic powder comprises Fe, and at least one of the following: Cr, Nb, Al, Si, and Ni.

In one embodiment, the third part 100D comprises a magnetic powder with D90 of the magnetic powder being not greater than 50 um.

In one embodiment, the permeability of the second part 100C is greater than the permeability of any other part of the magnetic body.

In one embodiment, each said part is made of a corresponding magnetic material, wherein at least three different magnetic materials are used to form all of the said parts.

In one embodiment, the electrical component is an inductor.

In one embodiment, the electrical component is an inductor, wherein the plurality of parts are pre-formed and made separately from each other.

In one embodiment, the third part 100D comprises a first magnetic powder and a second magnetic powder, wherein D50 of the first magnetic powder is greater than the D50 of the second magnetic powder, wherein the D90 of each of the first magnetic powder and the second magnetic powder is not greater than 50 um.

In one embodiment, the first part 100B comprises a third magnetic powder and a fourth magnetic powder, wherein D50 of the third magnetic powder is greater than the D50 of the fourth magnetic powder, wherein the D90 of each of the third magnetic powder and the fourth magnetic powder is not greater than 50 um.

In one embodiment, the fourth part 100A comprises a fifth magnetic powder and a sixth magnetic powder, wherein D50 of the fifth magnetic powder is greater than the D50 of the sixth magnetic powder, wherein the D90 of each of the fifth magnetic powder and the sixth magnetic powder is not greater than 50 um.

In one embodiment, each of the first part 100B, the second part 100C, the third part 100D, and the fourth part 100A respectively comprises a first magnetic powder and a second magnetic powder, wherein D50 of the first magnetic powder is greater than the D50 of the second magnetic powder, wherein the D90 of each of the first magnetic powder and the second magnetic powder is not greater than 50 um.

In one embodiment, each of the first part 100B, the second part 100C, the third part 100D, and the fourth part 100A respectively comprises the same first magnetic powder and the same second magnetic powder, wherein D50 of the first magnetic powder is greater than the D50 of the second magnetic powder, wherein the D90 of each of the first magnetic powder and the second magnetic powder is not greater than 50 um.

In one embodiment, an electrical component 700 is disclosed, wherein the electrical component 700 comprises: a magnetic body and a coil 100E disposed in the magnetic body, wherein the magnetic body is formed by a plurality of parts 100A, 100B, 100C, 100D, wherein the plurality of parts 100A, 100B, 100C, 100D comprises a first part 100B comprising a base, a second part 100C comprising a pillar, a third part 100D comprising a through-opening therein, and a fourth part 100A comprising a cover, wherein a bottom surface of the pillar of the second part 100C is disposed over a top surface of the base of the first part 100B with at least one portion of the pillar of the second part 100C being placed in a hollow space of the coil 100E, wherein the third part 100D is disposed over the top surface the base of the first part 100B with the pillar of the second part 100C and the coil 100E being placed in said through-opening of the third part 100D, wherein the cover of the fourth part 100A is disposed over the pillar of the second part 100C and the coil 100E with the base of the first part 100B and the cover of the fourth part 100A being located on two opposite sides of said bottom surface of the pillar of the second part 100C, wherein the magnetic body further comprises a sixth part 100G disposed over the fourth part, thereby increasing the capability of preventing erosion of the magnetic body.

In one embodiment, the sixth part 100G comprises an amorphous or a nanocrystalline magnetic powder.

In one embodiment, the sixth part 100G comprises a magnetic powder, wherein the magnetic powder comprises Fe, and at least one of the following: Cr, Nb, Al, Si, and Ni.

In one embodiment, an electrical component 700 is disclosed, wherein the electrical component 700 comprises: a magnetic body and a coil 100E disposed in the magnetic body, wherein the magnetic body is formed by a plurality of parts 100A, 100B, 100C, 100D, wherein the plurality of parts 100A, 100B, 100C, 100D comprises a first part 100B comprising a base, a second part 100C comprising a pillar, a third part 100D comprising a through-opening therein, and a fourth part 100A comprising a cover, wherein a bottom surface of the pillar of the second part 100C is disposed over a top surface of the base of the first part 100B with at least one portion of the pillar of the second part 100C being placed in a hollow space of the coil 100E, wherein the third part 100D is disposed over the top surface the base of the first part 100B with the pillar of the second part 100C and the coil 100E being placed in said through-opening of the third part 100D, wherein the cover of the fourth part 100A is disposed over the pillar of the second part 100C and the coil 100E with the base of the first part 100B and the cover of the fourth part 100A being located on two opposite sides of said bottom surface of the pillar of the second part 100C, wherein the magnetic body further comprises a fifth part 100F disposed under the first part and a sixth part 100G disposed over the fourth part, wherein each part is made of a corresponding magnetic material with at least three different magnetic materials being used to form all of the said parts.

In one embodiment, the electrical component is an inductor, wherein the plurality of parts are pre-formed and made separately from each other.

There are many ways to make the electrical component 700. For example, the first embodiment and the second embodiment described above can be used, but not limited to, to make the electrical component 700 by adding the fifth part under the base 100B in FIG. 4D or FIG. 5D, and by adding the sixth part over the cover 100A in FIG. 4D or FIG. 5D.

Figure 7B:
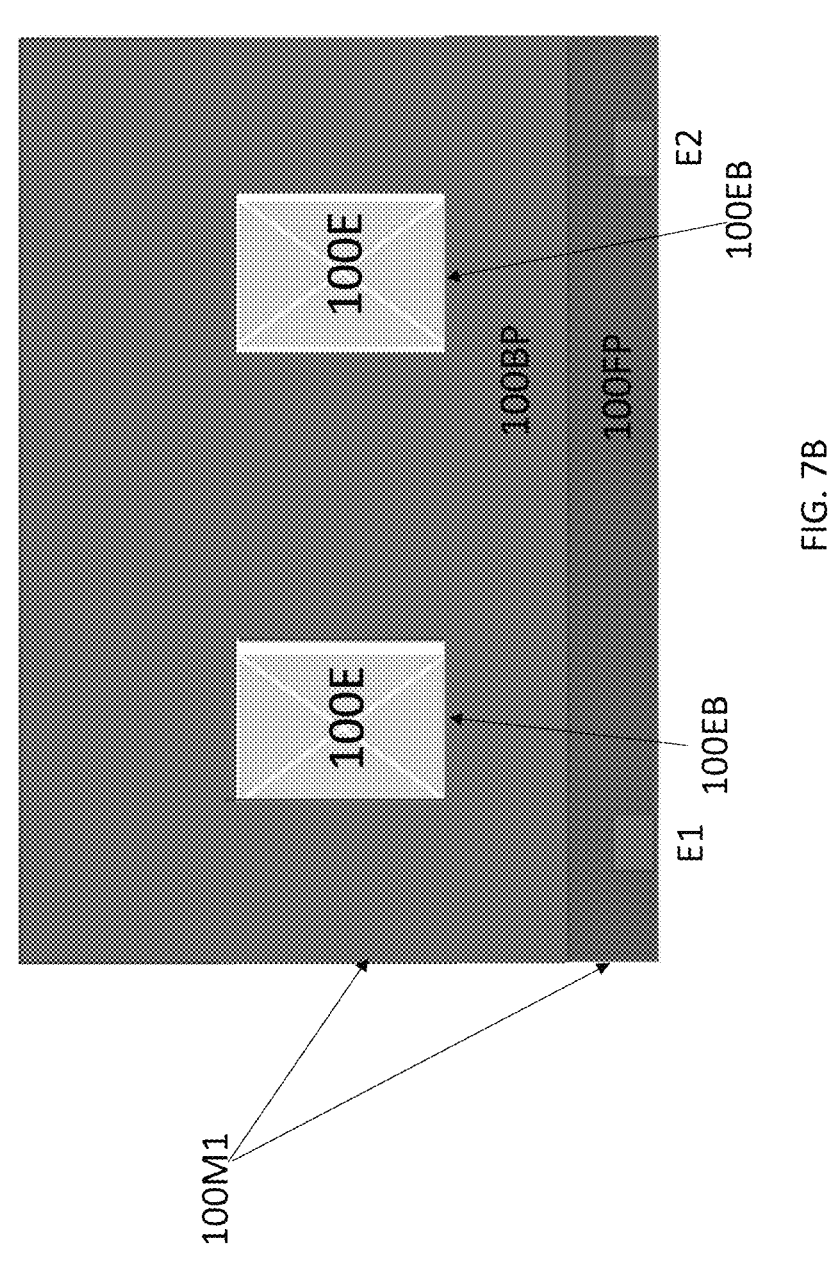
FIG. 7B illustrates a side view of an electrical component according to one embodiment of the present invention.

In one embodiment, as shown in FIG. 7B, which illustrates a side view of an electrical component 701, wherein the electrical component 701 comprises: a magnetic body 100M1 and a coil 100E disposed in the magnetic body 100M1, wherein the magnetic body 100M1 comprises a first magnetic portion 100BP and a second magnetic portion 100FP that is disposed under the first magnetic portion 100BP, wherein the first magnetic portion 100BP is located between a bottom surface 100EB of the coil 100E and the second magnetic portion 100FP, wherein at least one portion of the first electrode E1 and at least one portion of the second electrode E2 are disposed on the bottom surface of the second magnetic portion 100FP, wherein the first electrode E1 and the second electrode E2 are electrically connected to the coil 100E, wherein a resistivity of the second magnetic portion 100FP is greater than a resistivity of the first magnetic portion 100BP, thereby increasing the capability of withstand voltages applied to the electrodes so as to avoid short circuits between the electrodes, or between an electrode to the coil.

In one embodiment, the coil is formed by a conductive wire comprising the coil and a first end and a second end, wherein the coil is disposed in the magnetic body, and the first end and the second end portion is electrically connected to the first electrode E1 and the second electrode E2, respectively.

In one embodiment, the conductive wire comprises a metal wire and at least one insulating layer encapsulating the metal wire.

In one embodiment, an electroplating metal layer is disposed on the magnetic body, and the electroplating metal layer extends from the upper surface of the magnetic body to the lower surface of the magnetic body to electrically connect the first end portion.

In one embodiment, the second magnetic portion 100FP has an I shape.

In one embodiment, the electrical component 700 is an inductor.

In one embodiment, the resistivity of the second magnetic portion 100FP is greater than the resistivity of any other part of the magnetic body.

In one embodiment, the magnetic body 100M1 comprises a unitary magnetic body comprising the first magnetic portion 100BP, wherein the unitary magnetic body is located above the second magnetic portion 100FP and extends into a hollow space of the coil 100E.

In one embodiment, the magnetic body 100M1 comprises a unitary magnetic body comprising the first portion 100BP, wherein the unitary magnetic body is located above the second portion 100FP, wherein the unitary magnetic body encapsulates the top surface and side surfaces of the coil and extends into a hollow space of the coil 100E.

In one embodiment, the magnetic body 100M1 comprises a third portion disposed in a hollow space of the coil 100E, wherein the resistivity of the second magnetic portion 100FP is greater than the resistivity of the third portion of the magnetic body, and a permeability of the second magnetic portion 100FP is less than a permeability of the third portion of the magnetic body.

In one embodiment, said unitary magnetic body comprises a first magnetic powder and a second magnetic powder, wherein D50 of the first magnetic powder is greater than the D50 of the second magnetic powder, wherein the D90 of each of the first magnetic powder and the second magnetic powder is not greater than 50 um.

In one embodiment, the second magnetic portion 100FP comprises an amorphous or a nanocrystalline magnetic powder.

In one embodiment, the second magnetic portion 100FP comprises a magnetic powder, wherein the magnetic powder comprises Fe.

In one embodiment, the second magnetic portion 100FP comprises a magnetic powder, wherein the magnetic powder comprises Fe, and at least one of the following: Cr, Nb, Al, Si, and Ni.

In one embodiment, the second magnetic portion 100FP comprises a first magnetic powder and a second magnetic powder, wherein the D50 of the first magnetic powder is larger than the D50 of the second magnetic powder, wherein the first magnetic powder is mixed with the second magnetic powder, wherein the second magnetic portion 100FP is adhered to a bottom surface of the magnetic body 100M1.

In one embodiment, the first magnetic powder comprises ceramic powder. In one embodiment, the second magnetic portion 100FP comprises iron powder. In one embodiment, the average particle size of the first magnetic powder is 20 microns to 100 microns. In one embodiment, the average particle size of the second magnetic powder is 3 microns to 15 microns.

In one embodiment, the weight of the first powder is 60 wt %-90 wt % of the total weight of the first and the second magnetic powders, and the weight of the second powder is 10 wt %-40 wt % of the total weight of the first and the second magnetic powders.

In one embodiment, the second magnetic portion 100FP is formed on the bottom surface of the first magnetic portion 100BP.

In one embodiment, a method to form an electrical component is disclosed, the method comprising: forming a first magnetic sheet, wherein a plurality of bases are formed in the first magnetic sheet; forming a second magnetic sheet, wherein a plurality of pillars are formed in the second magnetic sheet; forming a third magnetic sheet, wherein a plurality of through openings are formed in the third magnetic sheet; and forming a fourth magnetic sheet, wherein a plurality of covers are formed in the fourth magnetic sheet; and forming a fifth magnetic sheet, wherein a plurality of lower covers are formed in the fifth magnetic sheet; stacking the first magnetic sheet, the second magnetic sheet, the third magnetic sheet, the fourth magnetic sheet and the fifth magnetic sheet for forming a magnetic body with a plurality of coils disposed in the magnetic body; and cutting the magnetic body into a plurality of pieces with each piece comprising a corresponding coil encapsulated by a corresponding portion of the magnetic body.

In one embodiment, said stacking step comprising: disposing a plurality of coils on the first magnetic sheet, wherein each coil is disposed on a corresponding base of the first magnetic sheet; stacking the second magnetic sheet over the first magnetic sheet, wherein each pillar of the second magnetic sheet is placed in a hollow space of a corresponding coil; stacking the third magnetic sheet over the first magnetic sheet, wherein each through-opening of the third magnetic sheet is placed over a corresponding base of the first magnetic sheet and surrounds a corresponding coil and a corresponding pillar of the second magnetic sheet; stacking the fourth magnetic sheet over the second magnetic sheet and the third magnetic sheet, wherein each cover of the fourth magnetic sheet is disposed over a corresponding pillar and a corresponding coil; and disposing the fifth magnetic sheet under the first magnetic sheet, wherein each lower cover is disposed on a corresponding base of the first magnetic sheet.

In one embodiment, said stacking step comprising: stacking the third magnetic sheet over the fourth magnetic sheet; disposing a plurality of coils on the fourth magnetic sheet, wherein each coil is placed in a corresponding through-opening of the third magnetic sheet; stacking the second magnetic sheet over the fourth magnetic sheet, wherein each pillar of the second magnetic sheet is placed in a hollow space of a corresponding coil; stacking the first magnetic sheet over the second magnetic sheet and the third magnetic sheet; and disposing the fifth magnetic sheet under the first magnetic sheet, wherein each lower cover is disposed on a corresponding base of the first magnetic sheet.

In one embodiment, said forming step further comprising forming a sixth magnetic sheet, wherein a plurality of upper covers are formed in the sixth magnetic sheet; and said stacking step further comprising stacking the sixth magnetic sheet over the fourth magnetic sheet for forming the magnetic body, wherein a corresponding upper cover is disposed over the cover.

From the foregoing, it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. An electrical component, comprising:
   a coil comprising a plurality of winding turns; and
   a magnetic body, comprising:
      a first part, comprising a first magnetic material;

a second part on the first part, and along a first side of the coil, and comprising a second magnetic material;
   a third part on the first part, and along a second side of the coil, wherein the second side is opposite to the first side, and comprising a third magnetic material, wherein the third magnetic material comprises a first magnetic powder and a second magnetic powder mixed with the first magnetic powder, wherein a D50 of the first magnetic powder is greater than a D50 of the second magnetic powder, wherein a D90 of the first magnetic powder is not greater than 50 μm, and a D90 of the second magnetic powder is not greater than 50 μm; and
   a fourth part on the coil, the second part and the third part, and comprising a fourth magnetic material, wherein the first magnetic material, the second magnetic material, the third magnetic material and the fourth magnetic material are different from each other.

2. The electrical component according to claim 1, wherein the plurality of winding turns of the coil is formed by a conductive wire, wherein the conductive wire comprises a metal wire and at least one insulating layer encapsulating the metal wire, wherein the first part comprises a base, the second part comprises a pillar, the third part comprises a through-opening, and the fourth part comprises a cover, wherein a bottom surface of the pillar is disposed over a top surface of the base with at least one portion of the pillar being placed in a hollow space of the coil, wherein the third part is disposed over the top surface of the base with the coil and at least one portion of the pillar being placed in said through-opening of the third part, wherein the cover is disposed over the pillar and the coil with the base and the cover being located on two opposite sides of the bottom surface of the pillar.

3. The electrical component according to claim 2, wherein the first magnetic powder comprises Fe.

4. The electrical component according to claim 2, wherein the second part comprises a nanocrystalline magnetic powder, wherein a permeability of the second part is greater than a permeability of the third part of the magnetic body.

5. The electrical component according to claim 2, wherein the first part comprises a third magnetic powder and a fourth magnetic powder mixed with the third magnetic powder, wherein a D50 of the third magnetic powder is greater than a D50 of the fourth magnetic powder, wherein a D90 of the third magnetic powder is not greater than 50 μm, and a D90 of the fourth magnetic powder is not greater than 50 um.

6. The electrical component according to claim 2, wherein the fourth part comprises a fifth magnetic powder and a sixth magnetic powder mixed with the fifth magnetic powder, wherein a D50 of the fifth magnetic powder is greater than a D50 of the sixth magnetic powder, wherein a D90 of the fifth magnetic powder is not greater than 50 μm, and a D90 of the sixth magnetic powder is not greater than 50 um.

7. The electrical component according to claim 2, wherein each of the first part, the third part, and the fourth part respectively comprises the first magnetic powder and the second magnetic powder.

8. The electrical component according to claim 1, wherein the electrical component is an inductor.

9. The electrical component according to claim 2, wherein the first part, the second part, the third part, and the fourth part are pre-formed and made separately from each other.

10. The electrical component according to claim 2, wherein the magnetic body further comprises a fifth part disposed under the first part, wherein at least one portion of a first electrode and at least one portion of a second electrode are disposed on a bottom surface of the fifth part, wherein the first electrode and the second electrode are electrically connected to the coil.

11. The electrical component according to claim 10, wherein the fifth part comprises an amorphous or a nanocrystalline magnetic powder.

12. The electrical component according to claim 10, wherein the fifth part comprises Fe and at least one of the following: Cr, Nb, Al, Si, and Ni.

13. The electrical component according to claim 10, wherein a resistivity of the fifth part disposed under the first part is greater than a resistivity of the first part.

14. The electrical component according to claim 10, wherein the magnetic body further comprises a sixth part disposed over the fourth part for increasing a capability of preventing erosion of the magnetic body.

15. The electrical component according to claim 14, wherein the sixth part comprises Fe and at least one of the following: Cr, Nb, Al, Si, and Ni.

16. An electrical component, comprising: a magnetic body and a coil disposed in the magnetic body, wherein the magnetic body is formed by a plurality of parts, wherein the plurality of parts comprise a first part comprising a base, a second part comprising a pillar, a third part comprising a through-opening and a bottom surface interfacing with a top surface of the base, and a fourth part comprising a cover, wherein a bottom surface of the pillar is disposed over the top surface of the base with at least one portion of the pillar being placed in a hollow space of the coil, wherein the third part is disposed over the top surface of the base with the coil and at least one portion of the pillar being placed in said through-opening of the third part, wherein the cover is disposed over the pillar and the coil with the base and the cover being located on two opposite sides of the bottom surface of the pillar, wherein the magnetic body further comprises a fifth part disposed under the first part, wherein at least one portion of a first electrode and at least one portion of a second electrode are disposed on a bottom surface of the fifth part, wherein the first electrode and the second electrode are electrically connected to the coil.

17. The electrical component according to claim 16, wherein a resistivity of the fifth part disposed under the first part is greater than a resistivity of the first part.

18. The electrical component according to claim 16, wherein a thickness of the fifth part is in a range of 30 μm to 60 μm, and a total thickness of the first part and the fifth part is in a range of 130 μm to 160 um.

19. The electrical component according to claim 16, wherein the magnetic body further comprises a sixth part disposed over the fourth part for increasing a capability for preventing erosion of the magnetic body.

20. The electrical component according to claim 19, wherein each of the first part, the second part, the third part, the fourth part, the fifth part, and the sixth part is made of a corresponding magnetic material with at least three different magnetic materials being used to form the first part, the second part, the third part, the fourth part, the fifth part, and the sixth part.

* * * * *